US012810934B2

(12) United States Patent
Zhou et al.

(10) Patent No.: US 12,810,934 B2
(45) Date of Patent: Nov. 24, 2026

(54) COMPLEMENTARY PHOTOTRANSISTOR PIXEL UNIT, SENSING AND COMPUTING ARRAY STRUCTURE AND OPERATION METHOD THEREOF

(71) Applicant: PEKING UNIVERSITY, Beijing (CN)

(72) Inventors: Zheng Zhou, Beijing (CN); Jiaqi Li, Beijing (CN); Guihai Yu, Beijing (CN); Jinfeng Kang, Beijing (CN); Xiaoyan Liu, Beijing (CN); Peng Huang, Beijing (CN)

(73) Assignee: Peking University, Beijing (CN)

( * ) Notice: Subject to any disclaimer, the term of this patent is extended or adjusted under 35 U.S.C. 154(b) by 365 days.

(21) Appl. No.: 18/578,854

(22) PCT Filed: Oct. 31, 2022

(86) PCT No.: PCT/CN2022/128624

§ 371 (c)(1),
(2) Date: Jan. 12, 2024

(87) PCT Pub. No.: WO2024/092406

PCT Pub. Date: May 10, 2024

(65) Prior Publication Data

US 2025/0104769 A1 Mar. 27, 2025

(51) Int. Cl.

*G11C 13/04* (2006.01)
*H10B 99/00* (2023.01)
*H10F 30/282* (2025.01)

(52) U.S. Cl.

CPC ........... *G11C 13/047* (2013.01); *H10B 99/22* (2023.02); *H10F 30/282* (2025.01)

(58) Field of Classification Search

CPC ..... G11C 13/047; H10B 99/22; H10F 30/282; H10D 99/00

See application file for complete search history.

(56) References Cited

U.S. PATENT DOCUMENTS 4,040,082 A * 8/1977 Goser .................... H10D 84/82 257/E27.059
5,393,994 A * 2/1995 Kobayashi ........... G06N 3/0675 257/85

(Continued)

FOREIGN PATENT DOCUMENTS

CN 110581190 A 12/2019
CN 111063702 A 4/2020

(Continued)

OTHER PUBLICATIONS

Othman, N., et al., Ultra-thin body and buried oxide (UTBB) SOI MOSFETs on Suppression of Short-Channel Effects (SCEs): A review, Advanced Materials Research, 1109, pp. 257-261 (2015).

(Continued)

*Primary Examiner* — S M Sohel Imtiaz
(74) *Attorney, Agent, or Firm* — Scully, Scott, Murphy & Presser, P.C.

(57) ABSTRACT

The present disclosure provides a complementary phototransistor pixel unit, a sensing and computing array structure and an operation method thereof. The complementary phototransistor pixel unit includes: a first photoelectric field effect transistor, which is a photoelectric field effect transistor based on an ultra-thin body and buried oxide layer; and a second photoelectric field effect transistor, the second photoelectric field effect transistor is a photoelectric field effect transistor based on an ultra-thin body and buried oxide layer, each of the first photoelectric field effect transistor and the second photoelectric field effect transistor is four-end device and has a gate electrode G, a source electrode S, a drain electrode D, and a well base electrode B, and the source electrode S or drain electrode D of the first photoelectric field effect transistor is connected to the source electrode S (Continued)

or drain electrode D of the second photoelectric field effect transistor.

18 Claims, 8 Drawing Sheets

(56) References Cited

U.S. PATENT DOCUMENTS

| | | | | |
|---|---|---|---|---|
| 11,881,274 | B2 * | 1/2024 | Chang | G11C 17/16 |
| 2017/0269782 | A1 * | 9/2017 | Wu | H10F 30/221 |
| 2021/0217454 | A1 * | 7/2021 | Ocker | H10B 53/30 |

FOREIGN PATENT DOCUMENTS

| | | | | |
|---|---|---|---|---|
| CN | 113964121 A | | 1/2022 | |
| CN | 114791796 A | | 7/2022 | |
| CN | 115172396 A | * | 10/2022 | H10F 39/811 |

OTHER PUBLICATIONS

Skotnicki, T. et.al, "UTBB FDSOI: Evolution and opportunities", Solid-State Electronics, 125 (2016), pp. 63-72.

Schwarzenbach, W., et.al, Ultra-thin body & buried oxide SOI substrate development and qualification for Fully Depleted SOI device with back bias capability, Solid-State Electronics, 117 (2016), pp. 2-9.

* cited by examiner

COMPLEMENTARY PHOTOTRANSISTOR PIXEL UNIT, SENSING AND COMPUTING ARRAY STRUCTURE AND OPERATION METHOD THEREOF

CROSS-REFERENCE TO RELATED APPLICATION

This application is a Section 371 National Stage Application of International Application No. PCT/CN2022/128624, filed on Oct. 31, 2022, entitled "COMPLEMENTARY PHOTOTRANSISTOR PIXEL UNIT, SENSING AND COMPUTING ARRAY STRUCTURE AND OPERATION METHOD THEREOF", the content of which is hereby incorporated by reference in its entirety.

TECHNICAL FIELD

The present disclosure relates to fields of semiconductor devices, integrated circuits and image sensing technology, and in particular, to a complementary phototransistor pixel unit capable of simultaneously calculating positive and negative weight values, a complementary phototransistor sensing and computing array structure adapted for high parallel vector-matrix multiplication and an operation method thereof, and a high parallel convolution implementation method adapted for in-sensor computing applications.

BACKGROUND

The traditional sensing and computing architecture generally consists of three parts: a sensing unit, a storage medium, and a computing core, which are interconnected through the bus. With the development of Internet of Things and big data, the amount of redundant data transmission between the sensing unit, the storage medium, and the computing core is increasing greatly, which severely limits hardware computing efficiency and increasing system power consumption.

In-sensor computing aims to achieve the fusion of sensing and computing functions through the devices and circuits co-optimization. This approach reduces data movement, lowers latency and power consumption, thereby improves system energy efficiency, making it an important technical pathway for edge sensing and computing. Currently, array structures composed of novel photo-sensitive devices are used to perform vector-matrix multiplication in conjunction with peripheral circuits, representing an important implementation form of in-sensor computing.

However, existing solutions face two main problems. Firstly, implementing positive and negative weights requires the design of different readout and control circuits, increasing the complexity of the array structure and operation methods. Secondly, to meet the requirements of reusing the operational matrix, the array interconnection structure and timing operations are highly complex, resulting in low computational parallelism.

SUMMARY

In view of the above, the present disclosure proposes a complementary phototransistor pixel unit capable of simultaneously calculating positive and negative weight values, a complementary phototransistor sensing and computing array structure adapted for high parallel vector-matrix multiplication and an operation method thereof, and a high parallel convolution implementation method adapted for in-senor computing, so as to simplify the complexity of array structures and operation methods, improve the operational parallelism, and meet the requirement of reusing the operational matrix.

According to one aspect of embodiments of the present disclosure, there is provided a complementary phototransistor pixel unit capable of simultaneously calculating positive and negative weight values, where the complementary phototransistor pixel unit includes: a first photoelectric field effect transistor, where the first photoelectric field effect transistor is a photoelectric field effect transistor based on an ultra-thin body and buried oxide layer (UTBB); and a second photoelectric field effect transistor, where the second photoelectric field effect transistor is a photoelectric field effect transistor based on an ultra-thin body and buried oxide layer, and a type of the second photoelectric field effect transistor is different from a type of the first photoelectric field effect transistor, where each of the first photoelectric field effect transistor and the second photoelectric field effect transistor is a four-terminal device and has a gate electrode G, a source electrode S, a drain electrode D, and a well base electrode B, and the source electrode S or the drain electrode D of the first photoelectric field effect transistor is connected to the source electrode S or the drain electrode D of the second photoelectric field effect transistor.

In above-mentioned solutions, each of the first photoelectric field effect transistor and the second photoelectric field effect transistor includes: a doped well, and a UTBB field effect transistor formed on the doped well, where a doping type of the doped well is n-type or p-type, and the UTBB field effect transistor is an NMOS transistor or a PMOS transistor.

In above-mentioned solutions, for the first photoelectric field effect transistor and the second photoelectric field effect transistor, when the doping types of the doping wells of the first photoelectric field effect transistor and the second photoelectric field effect transistor are the same, the types of the UTBB field effect transistors of the first photoelectric field effect transistor and the second photoelectric field effect transistor are different, and when the doping types of the doping wells of the first photoelectric field effect transistor and the second photoelectric field effect transistor are different, the types of the UTBB field effect transistors of the first photoelectric field effect transistor and the second photoelectric field effect transistor are the same.

In above-mentioned solutions, a type of the first photoelectric field effect transistor is N-p (NMOS on p-type well), a type of the second photoelectric field effect transistor is N-n (NMOS on n-type well), and the source electrode S of the first photoelectric field effect transistor is connected to the source electrode S of the second photoelectric field effect transistor to form a common source electrode, denoted as $I_{OUT}$.

In above-mentioned solutions, the complementary phototransistor pixel unit utilizes complementary photoelectric characteristics of the first photoelectric field effect transistor and the second photoelectric field effect transistor to input a negative weight into an exposed first photoelectric field effect transistor to complete operation, and input a positive weight into an exposed second photoelectric field effect transistor to complete operation, thereby allowing positive and negative weight operations to be compatible within one pixel unit.

In above-mentioned solutions, the complementary phototransistor pixel unit is capable of performing exposure, readout, and reset functions in operation, including: during exposure, a collection and conversion of an optical signal in the pixel unit is implemented by controlling a flip of a voltage of the well base electrode; during readout, the device is turned on or off by controlling a flip of a voltage of the gate electrode, a weight value input is completed by controlling a flip of a voltage of the drain electrode, an analog operation is completed inside the pixel unit, and a result is represented by a common source current; and during reset, a reset function of the pixel unit is completed by controlling a level signal of each port to return to zero, so as to prepare for a next exposure.

In above-mentioned solutions, a type of the first photoelectric field effect transistor is P-p (PMOS on p-type well), a type of the second photoelectric field effect transistor is P-n (PMOS on n-type well), and the drain electrode D of the first photoelectric field effect transistor is connected to the drain electrode D of the second photoelectric field effect transistor to form a common drain electrode, denoted as $I_{OUT}$.

In above-mentioned solutions, the complementary phototransistor pixel unit utilizes complementary photoelectric characteristics of the first photoelectric field effect transistor and the second photoelectric field effect transistor to input a positive weight into an exposed first photoelectric field effect transistor to complete operation, and input a negative weight into an exposed second photoelectric field effect transistor to complete operation, thereby allowing positive and negative weight operations to be compatible within one pixel unit.

In above-mentioned solutions, the complementary phototransistor pixel unit is capable of performing exposure, readout, and reset functions in operation, including: during exposure, a collection and conversion of an optical signal in the pixel unit is implemented by controlling a flip of a voltage of the well base electrode; during readout, the device is turned on or off by controlling a flip of a voltage of the gate electrode, a weight value input is completed by controlling a flip of a voltage of the source electrode, an analog operation is completed inside the pixel unit, and a result is represented by a common drain current; and during reset, a reset function of the pixel unit is completed by controlling a level signal of each port to return to zero, so as to prepare for a next exposure.

In above-mentioned solutions, a type of the first photoelectric field effect transistor is N-p (NMOS on p-type well), a type of the second photoelectric field effect transistor is P-p (PMOS on a p-type well), and the source electrode S of the first photoelectric field effect transistor is connected to the drain electrode D of the second photoelectric field effect transistor to form a common output, denoted as $I_{OUT}$.

In above-mentioned solutions, the complementary phototransistor pixel unit utilizes complementary photoelectric characteristics of the first photoelectric field effect transistor and the second photoelectric field effect transistor to input a negative weight into an exposed first photoelectric field effect transistor to complete operation, and input a positive weight into an exposed second photoelectric field effect transistor to complete operation, thereby allowing positive and negative weight operations to be compatible within one pixel unit.

In above-mentioned solutions, the complementary phototransistor pixel unit is capable of performing exposure, readout, and reset functions in operation, including: during exposure, a collection and conversion of an optical signal in the pixel unit is implemented by controlling a flip of a voltage of the well base electrode; during readout, the device is turned on or off by controlling a flip of a voltage of the gate electrode, a weight value input is completed by controlling a flip of a voltage of the drain electrode of the first photoelectric field effect transistor or a flip of a voltage of the source electrode of the second photoelectric field effect transistor, an analog operation is completed inside the pixel unit, and a result is represented by a common output current; and during reset, a reset function of the pixel unit is completed by controlling a level signal of each port to return to zero, so as to prepare for a next exposure.

In above-mentioned solutions, a type of the first photoelectric field effect transistor is N-n (NMOS on n-type well), a type of the second photoelectric field effect transistor is P-n (PMOS on n-type well), and the source electrode S of the first photoelectric field effect transistor is connected to the drain electrode D of the second photoelectric field effect transistor to form a common output, denoted as $I_{OUT}$.

In above-mentioned solutions, the complementary phototransistor pixel unit utilizes complementary photoelectric characteristics of the first photoelectric field effect transistor and the second photoelectric field effect transistor to input a positive weight into an exposed first photoelectric field effect transistor to complete operation, input a negative weight into an exposed second photoelectric field effect transistor to complete operation, thereby allowing positive and negative weight operations to be compatible within one pixel unit.

In above-mentioned solutions, the complementary phototransistor pixel unit is capable of performing exposure, readout, and reset functions in operation, including: during exposure, a collection and conversion of an optical signal in the pixel unit is implemented by controlling a flip of a voltage of the well base electrode; during readout, the device is turned on or off by controlling a flip of a voltage of the gate electrode, a weight value input is completed by controlling a flip of a voltage of the drain electrode of the first photoelectric field effect transistor or a flip of a voltage of the source electrode of the second photoelectric field effect transistor, an analog operation is completed inside the pixel unit, and a result is represented by a common output current; and during reset, a reset function of the pixel unit is completed by controlling a level signal of each port to return to zero, so as to prepare for a next exposure.

According to another aspect of embodiments of the present disclosure, there provides a complementary phototransistor sensing and computing array structure adapted for high parallel vector-matrix multiplication, including: a plurality of complementary phototransistor pixel units, where the plurality of complementary phototransistor pixel units are arranged in an array structure.

In above-mentioned solutions, in order to implement row gating and weight value input functions, the connection relationship of a plurality of complementary phototransistor pixel units located in a same row of the complementary phototransistor sensing and computing array structure is as follows: The $V_{Bn}$ ends of the plurality of complementary phototransistor pixel units located in the same row are all connected to a first exposure enabling control line $EN^+$, and $V_{Bp}$ ends of the plurality of complementary phototransistor pixel units located in the same row are all connected to a second exposure enabling control line $EN^-$; $V_{Gn}$ ends of the plurality of complementary phototransistor pixel units located in the same row are all connected to a first word line $WL^+$, and $V_{Gp}$ ends of the plurality of complementary phototransistor pixel units located in the same row are all connected to a second word line $WL^-$. Additionally, the $V_{Dn}$ ends of the plurality of complementary phototransistor pixel units located in the same row are all connected to a first bit line $BL^+$, and $V_{Dp}$ ends of the plurality of complementary phototransistor pixel units located in the same row are all connected to a second bit line $BL^-$.

In above-mentioned solutions, a connection relationship of a plurality of complementary phototransistor pixel units located in a same column of the complementary phototransistor sensing and computing array structure is as follows to implement the current collection along column direction: $I_{OUT}$ ends of the plurality of complementary phototransistor pixel units located in the same column are all connected to a source line SL.

According to another aspect of embodiments of the present disclosure, there is further provided a method of operating the complementary phototransistor sensing and computing array structure, where the method includes: during parallel vector-matrix operation, flipping levels of a first exposure enabling control line $EN^+$, a second exposure enabling control line $EN^-$, a first word line $WL^+$, and a second word line $WL^-$ of a specific row to implement exposure and selection of pixel units of the specific rows, inputting a weight value into the specific row through the bit line, and completing an analog operation inside each pixel unit, where operation results are represented by the source line current of each column.

In above-mentioned solutions, the method further includes: during the exposure period, flipping a level of a second exposure enabling control line $EN^-$ or a level of a first exposure enabling control line $EN^+$ of the specific row to implement exposure to the pixel units of the specific row.

In above-mentioned solutions, during the exposure period, for positive weights, the level of the first exposure enabling control line $EN^+$ is controlled to flip; and for negative weights, the level of the second exposure enabling control line $EN^-$ is controlled to flip.

In above-mentioned solutions, the method further includes: during the readout period, flipping the level of the second word line $WL^-$ or the first word line $WL^+$ of the specific row to implement selection of the pixel units in the specific row; and controlling the level of the second bit line $BL^-$ or the first bit line $BL^+$ of the specific row to flip to implement weight input; and during the period, collecting the current in source line SL of each column, so that an operation result is read out.

In above-mentioned solutions, during the readout period, when implementing the selection of the pixel units in the row, for positive weights, the level of the first word line $WL^+$ is controlled to flip; for negative weights, the level of the second word line $WL^-$ is controlled to flip. During the readout period, when implementing weight input, for positive weights, the level of the first bit line $BL^+$ is controlled to flip; for negative weights, the level of the second bit line $BL^-$ is controlled to flip.

In above-mentioned solutions, the method further includes: during the reset period, resetting levels of the first exposure enabling control line $EN^+$, the second exposure enabling control line $EN^-$, the first word line $WL^+$, the second word line $WL^-$, the first bit line $BL^+$ and the second bit line $BL^-$, and returning array state to the initial state.

According to another aspect of embodiments of the present disclosure, a high parallel convolution operation method for the complementary phototransistor sensing and computing array structure is provided. The method includes the following steps: during the readout period and the reset period, under the readout clock signal, the first word line $WL^+$ or the second word line $WL^-$ is selectively activated based on the positive or negative values in the first column vector of the queue, and controlling a weight value of the vector to be input into the array through the first bit line $BL^+$ or the second bit line $BL^-$ of 1 to k rows, outputting results of analog operations completed in the array in parallel through the source line SL of each column, and selecting effective data columns $SL_k$ to $SL_n$ to store in a register; controlling the second column vector of the queue to be input into the array to complete operation under a next readout clock signal, and selecting effective data columns $SL_{k-1}$ to $SL_{n-1}$ to store in the register; repeating the above process under the control of a readout clock until the last column vector of the queue is input into the array to complete operation, and selecting effective data columns $SL_1$ to $SL_{n-k}$ to store in the register, and correspondingly adding effective data of each column vector operation by an addition circuit for operation results of the whole queue, so as to obtain $1\times(n-k)$ row vector which is the first row of output matrix; and then controlling the selected row of the array to move downwards row by row, repeating the above process, sequentially inputting k column vectors of the queue into the array for operation, correspondingly adding effective data of each column vector operation by the addition circuit, sequentially obtaining the second row to the $(n-k)^{th}$ row of the output matrix, and finally obtaining a $(n-k)\times(n-k)$ output matrix.

In above-mentioned solutions, the method further includes: after completing the above process, resetting signals of each control line and waiting for a next operation process.

In above-mentioned solutions, the method adopts a one-exposure multi-reading mode when the convolution operation is performed on the array, so that the second exposure enabling control line $EN^-$ and the first exposure enabling control line $EN^+$ of a specific row are exposed simultaneously during exposure period to adapt to the readout of positive and negative weight values during the readout period.

In above-mentioned solutions, for a case that the convolution step size is not 1, the method adjusts the selection and storage of operation result of the source line SL when a convolution operation is performed on the array.

In above-mentioned solutions, the method further includes: during a preprocessing period, dividing a $k\times k$ convolution kernel into k column vectors, and sequentially arranging the k column vectors from right to left, where a rightmost vector of the convolution kernel is the first vector in a queue, and k is a natural number.

In above-mentioned solutions, the method further includes: during the exposure period, for a $m\times n$ input matrix, exposing m rows of the $m\times n$ input matrix by the first exposure enabling control line $EN^+$ or the second exposure enabling control line $EN^-$ to complete a collection and conversion of the optical signal, where m and n are natural numbers.

In above-mentioned solutions, during the exposure period, a partial exposure of non-global exposure or a drum exposure method is used for a larger array.

BRIEF DESCRIPTION OF THE DRAWINGS

For a more complete understanding of the present disclosure and the advantages thereof, reference is now made to the following description taken in conjunction with the accompanying drawings, which are incorporated in the specification and constitute a part of the specification, illustrate embodiments consistent with the present disclosure and together with the description serve to explain the principle of the present disclosure.

DETAILED DESCRIPTION OF EMBODIMENTS

In order to make objectives, technical solutions and advantages of the present disclosure more apparent and understandable, the present disclosure is further described in detail below in combination with specific embodiments and with reference to the accompanying drawings.

Embodiments of the present disclosure will be described below with reference to the accompanying drawings. It should be understood, however, that these descriptions are merely exemplary and are not intended to limit the scope of the present disclosure. In the following detailed descriptions, for purposes of explanation, numerous specific details are set forth in order to provide a thorough understanding of embodiments of the present disclosure. It is obvious, however, that one or more embodiments may be implemented without these specific details. In addition, in the following descriptions, descriptions of well-known structures and technologies are omitted to avoid unnecessarily obscuring the concept of the present disclosure.

Figure 1:
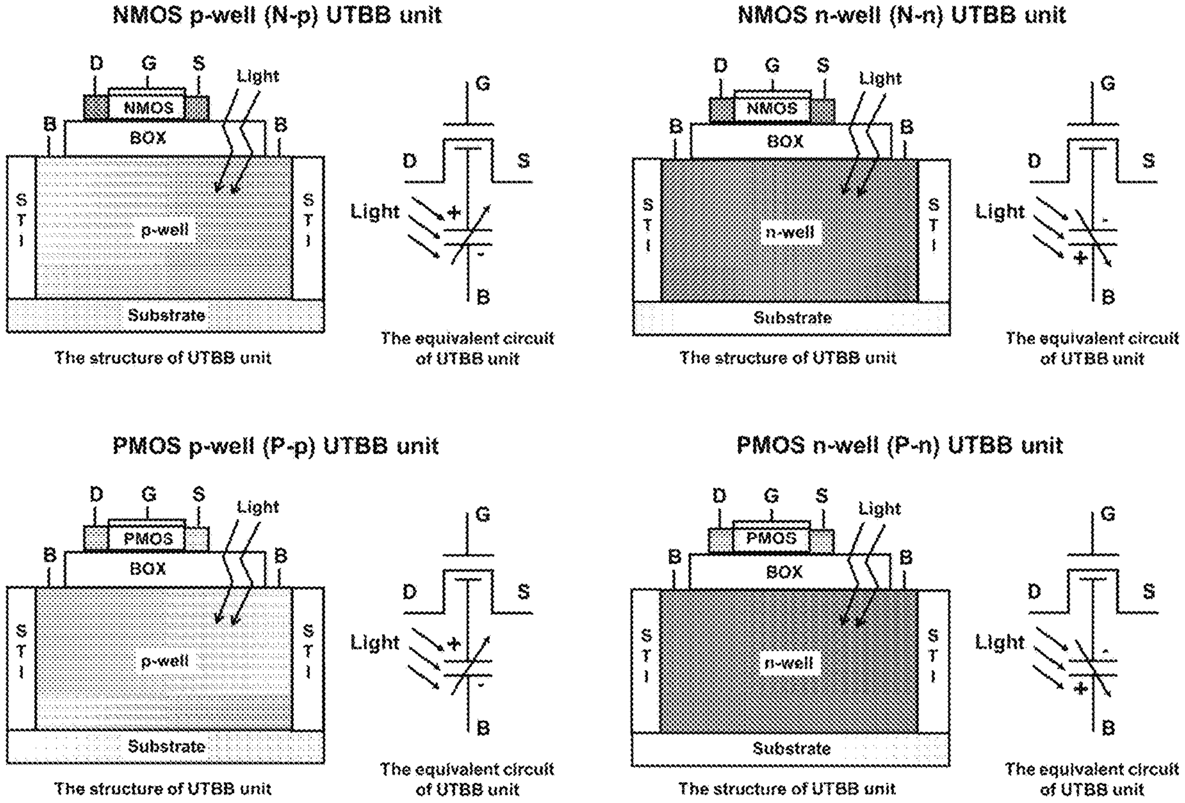
FIG. 1 shows a schematic diagram of the structure and the equivalent circuit of the UTBB photoelectric field effect transistor.

FIG. 1 shows a schematic diagram of the structure and the equivalent circuit of a photoelectric field effect transistor based on an ultra-thin body and buried oxide layer. An n/p well is formed on an undoped silicon substrate, and an N-type/P-type UTBB transistor is placed above the well. The n/p well is surrounded by silicon dioxide shallow trench isolation (STI) to suppress possible crosstalk after scale integration, forming the structure of the UTBB photoelectric field effect transistor. During exposure, incident light passes through an exposure area in FIG. 1, and there is no light absorption in the transistor. Photons passing through the buried oxygen are absorbed by the n/p well under the exposure region and converted into photogenic charge carriers. The photoelectric field effect transistor is a four-end device and includes a gate electrode G, a source electrode S, a drain electrode D, and a well base electrode B, and is composed of a UTBB field effect transistor and a doped well below.

Figure 2:
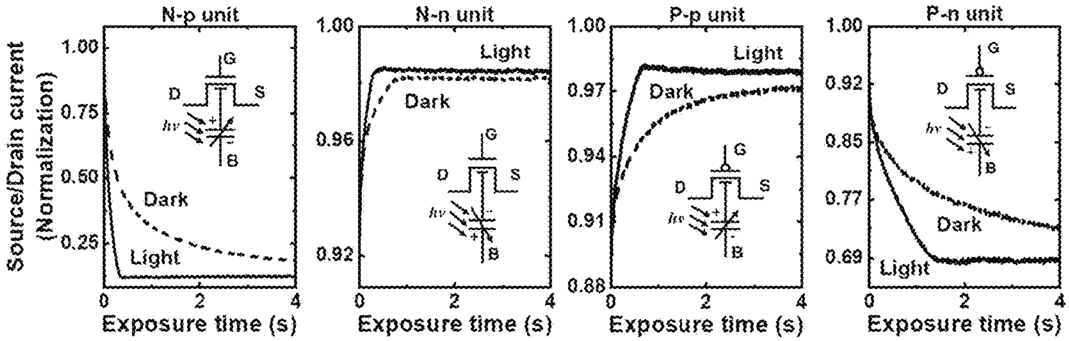
FIG. 2 shows a diagram of test results of source/drain current variation with exposure time of the UTBB photoelectric field effect transistor.

Due to the differences in the types of UTBB field effect transistors (NMOS/PMOS) and well doping (n-type and p-type), the optoelectronic field effect transistor provided in the present disclosure has four types in total, i.e., N-p (NMOS on p-type well) unit, N-n (NMOS on n-type well) unit, P-p (PMOS on p-type well) unit, and P-n (PMOS on n-type well) unit. The four types of photoelectric field effect transistors exhibit different photosensitive characteristics under lighting conditions, where the source/drain current $I_{DS}$ decreases when N-p unit and P-n unit are exposed, and the source/drain current $I_{DS}$ increases when N-n unit and P-p unit are exposed. FIG. 2 shows a diagram of test results of source/drain current variation with exposure time of the UTBB photoelectric field effect transistor.

Based on complementary optoelectronic characteristics of the UTBB photoelectric field effect transistor described above, i.e., the source/drain current $I_{DS}$ decreases when N-p unit and P-n unit are exposed, and the source/drain current $I_{DS}$ increases when N-n unit and P-p unit are exposed. The present disclosure provides a complementary phototransistor pixel unit capable of simultaneously calculating positive and negative weight values, where the complementary phototransistor pixel unit includes: a first photoelectric field effect transistor, where the first photoelectric field effect transistor is a photoelectric field effect transistor based on an ultra-thin body and buried oxide layer; and a second photoelectric field effect transistor, where the second photoelectric field effect transistor is a photoelectric field effect transistor based on an ultra-thin body and buried oxide layer, and a type of the second photoelectric field effect transistor is different from a type of the first photoelectric field effect transistor, where the first photoelectric field effect transistor and the second photoelectric field effect transistor are both four-end devices and are provided with a gate electrode G, a source electrode S, a drain electrode D, and a well base electrode B, and the source electrode S or the drain electrode D of the first photoelectric field effect transistor is connected to the source electrode S or the drain electrode D of the second photoelectric field effect transistor.

According to embodiments of the present disclosure, the first photoelectric field effect transistor and the second photoelectric field effect transistor each include: a doped well; and a UTBB field effect transistor formed on the doped well, where a doping type of the doped well is n-type or p-type, and the UTBB field effect transistor is an NMOS transistor or a PMOS transistor.

According to embodiments of the present disclosure, for the first photoelectric field effect transistor and the second photoelectric field effect transistor, when the doping types of the doping wells of the first photoelectric field effect transistor and the second photoelectric field effect transistor are the same, the types of the UTBB field effect transistors of the first photoelectric field effect transistor and the second photoelectric field effect transistor are different, and when the doping types of the doping wells of the first photoelectric field effect transistor and the second photoelectric field effect transistor are different, the types of the UTBB field effect transistors of the first photoelectric field effect transistor and the second photoelectric field effect transistor are the same.

The present disclosure adopts a pair of different types of photoelectric field effect transistors to form a complementary phototransistor pixel unit, which may simultaneously calculate positive and negative weight values without the need to design different readout and control circuits, simplifying the complexity of array structure and operation method.

FIG. 3A to FIG. 3D are schematic structural diagrams of four complementary phototransistor pixel units composed of N-p unit and N-n unit, P-p unit and P-n unit, N-p unit and P-p unit, and N-n unit and P-n unit according to embodiments of the present disclosures.

Figure 3A:
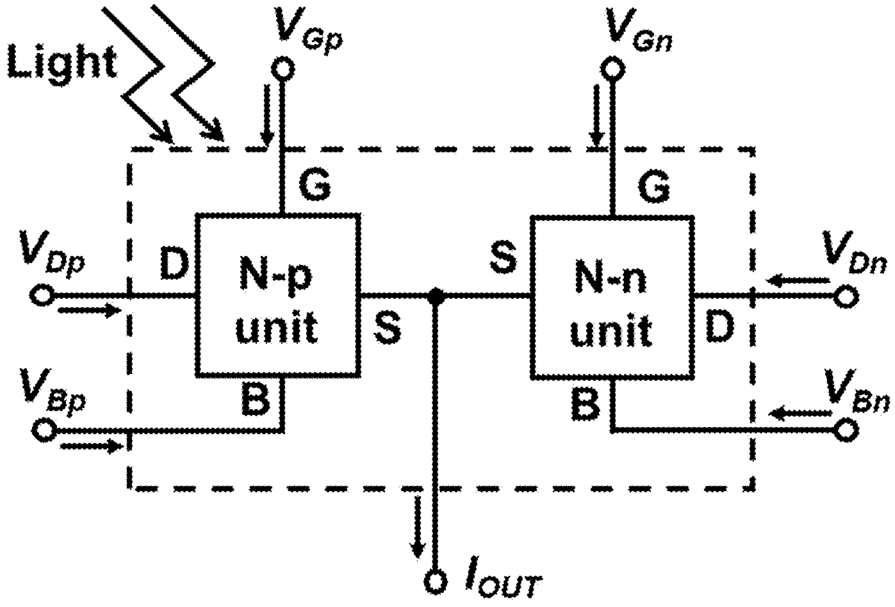
FIG. 3A shows a schematic structural diagram of the complementary phototransistor pixel unit composed of N-p unit and N-n unit according to embodiments of the present disclosure.

In the complementary phototransistor pixel unit composed of N-p unit and N-n unit shown in FIG. 3A, a type of the first photoelectric field effect transistor is N-p, i.e., NMOS on a p-type well, a type of the second photoelectric field effect transistor is N-n, i.e., NMOS on a n-type well, and the source electrode S of the first photoelectric field effect transistor is connected to the source electrode S of the second photoelectric field effect transistor to form a common source electrode, denoted as $I_{OUT}$, and other ports are individually led out: the gate electrodes are denoted as $V_{Gp}$ (the gate electrode of N-p unit) and $V_{Gn}$ (the gate electrode of N-n unit), the drain electrodes D are denoted as $V_{Dp}$ (the drain electrode of N-p unit) and $V_{Dn}$ (the drain electrode of N-n unit), and the well base electrodes B are denoted as $V_{Bp}$ (the well base electrode of N-p unit) and $V_{Bn}$ (the well base electrode of N-n unit).

The complementary phototransistor pixel unit utilizes complementary photoelectric characteristics of the first photoelectric field effect transistor and the second photoelectric field effect transistor to input a negative weight into the exposed first photoelectric field effect transistor to complete operation, and input a positive weight into the exposed second photoelectric field effect transistor to complete operation, thereby allowing positive and negative weight operations to be compatible within one pixel unit.

The complementary phototransistor pixel unit could perform exposure, readout, and reset functions in operation, specifically including: during exposure, a collection and conversion of an optical signal in the pixel unit is implemented by controlling a flip of a voltage of the well base electrode; during readout, a device is turned on or off by controlling a flip of a voltage of the gate electrode, and a weight value input is completed by controlling a flip of a voltage of the drain electrode, then an analog operation is completed inside the pixel unit, and a result is represented by a common source current; and during reset, a reset function of the pixel unit is completed by controlling a level signal of each port to return to zero, so as to prepare for a next exposure.

An operation method is that: $V_{Bp}$ and $V_{Bn}$ complete an exposure process by regulating a well voltage, achieving the collection and conversion of light signal in the pixel unit; $V_{Gp}$ and $V_{Gn}$ determine the gating on and off of the device by regulating a gate voltage; $V_{Dp}$ and $V_{Dn}$ respectively carry positive and negative weight information in a form of voltage (if the weight is a negative value, the weight is input into the N-p unit through $V_{Dp}$; if the weight is a positive value, the weight is input into the N-n unit through $V_{Dn}$), so as to complete the operation process of positive/negative weight and input inside the unit; and the operation result is collected by $I_{OUT}$.

Specifically, when the weight is a positive value, the exposure is implemented by regulating the well base voltage $V_{Bn}$ of the N-n unit, the device selection is implemented by regulating the gate voltage $V_{Gn}$, the weight input is implemented by regulating the drain voltage $V_{Dn}$, and the operation result is collected at the common source electrode. Similarly, when the weight is a negative value, the calculation process is completed by regulating the voltage of each port of the N-p unit, and the process is similar, which will not be described in detail here.

Figure 3B:
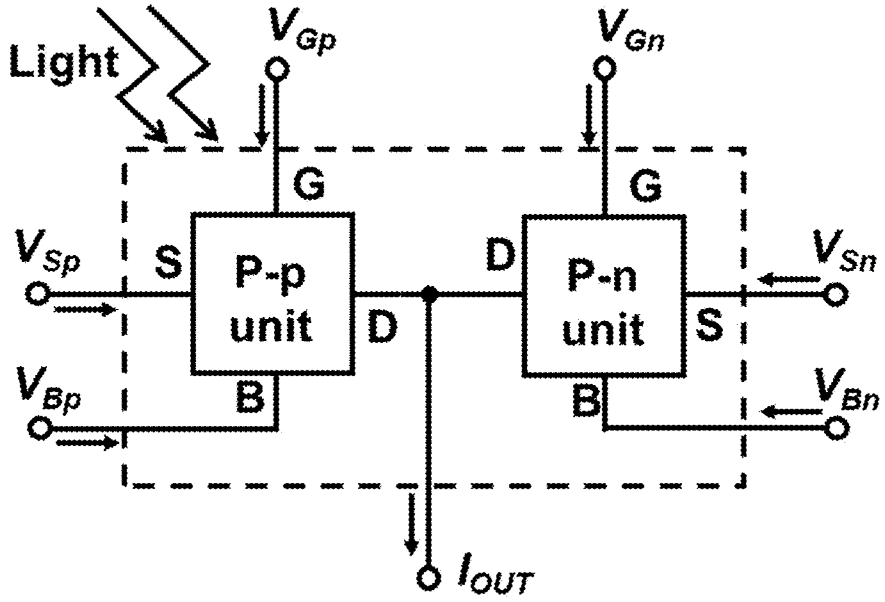
FIG. 3B shows a schematic structural diagram of the complementary phototransistor pixel unit composed of P-p unit and P-n unit according to embodiments of the present disclosure.

In the complementary phototransistor pixel unit composed of P-p unit and P-n unit shown in FIG. 3B, a type of the first photoelectric field effect transistor is P-p, i.e., PMOS on a p-type well, a type of the second photoelectric field effect transistor is P-n, i.e., PMOS on a n-type well, the drain electrode D of the first photoelectric field effect transistor is connected to the drain electrode D of the second photoelectric field effect transistor to form a common drain electrode, denoted as $I_{OUT}$, and other ports are separately led out.

The complementary phototransistor pixel unit utilizes complementary photoelectric characteristics of the first photoelectric field effect transistor and the second photoelectric field effect transistor to input a positive weight into the exposed first photoelectric field effect transistor to complete operation, and input a negative weight into the exposed second photoelectric field effect transistor to complete operation, thereby allowing positive and negative weight operations to be compatible within one pixel unit.

The complementary phototransistor pixel unit could perform exposure, readout, and reset functions in operation, specifically including: during exposure, a collection and conversion of an optical signal in the pixel unit is implemented by controlling a flip of a voltage of the well base electrode; during readout, a device is turned on or off by controlling a flip of a voltage of the gate electrode, and a weight value input is completed by controlling a flip of a voltage of the source electrode, then an analog operation is completed inside the pixel unit, and a result is represented by a common drain current; and during reset, a reset function of the pixel unit is completed by controlling a level signal of each port to return to zero, so as to prepare for a next exposure.

Figure 3C:
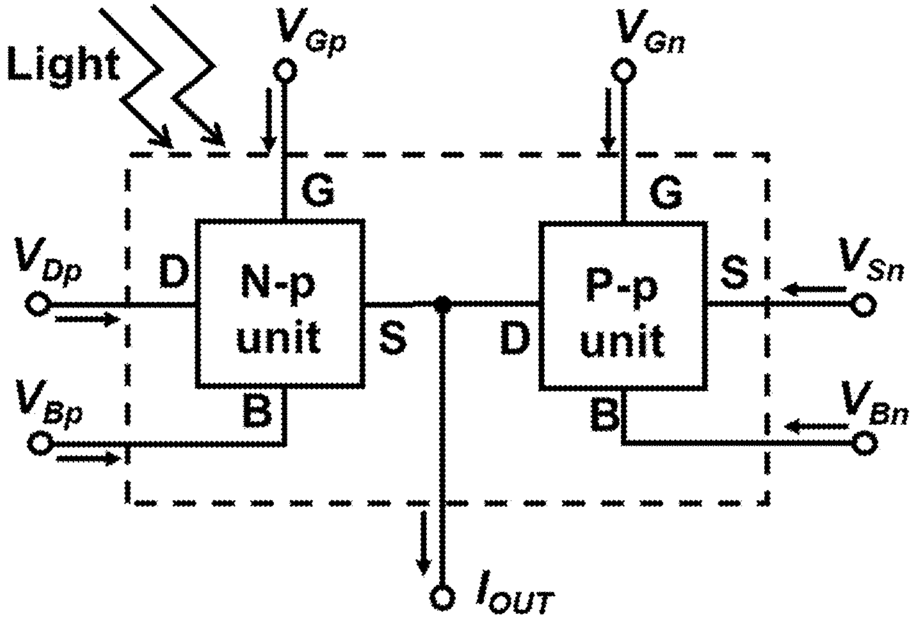
FIG. 3C shows a schematic structural diagram of the complementary phototransistor pixel unit composed of N-p unit and P-p unit according to embodiments of the present disclosure.

In the complementary phototransistor pixel unit composed of N-p unit and P-p unit shown in FIG. 3C, a type of the first photoelectric field effect transistor is N-p, i.e., NMOS on a p-type well, a type of the second photoelectric field effect transistor is P-p, i.e., PMOS on a p-type well, the source electrode S of the first photoelectric field effect transistor is connected to the drain electrode D of the second photoelectric field effect transistor to form a common output, denoted as $I_{OUT}$, and other ports are separately led out.

The complementary phototransistor pixel unit utilizes complementary photoelectric characteristics of the first photoelectric field effect transistor and the second photoelectric field effect transistor to input a negative weight into the exposed first photoelectric field effect transistor to complete operation, and input a positive weight into the exposed second photoelectric field effect transistor to complete operation, thereby allowing positive and negative weight operations to be compatible within one pixel unit.

The complementary phototransistor pixel unit could perform exposure, readout, and reset functions in operation, specifically including: during exposure, a collection and conversion of an optical signal in the pixel unit is implemented by controlling a flip of a voltage of the well base electrode; during readout, a device is turned on or off by controlling a flip of a voltage of the gate electrode, and a weight value input is completed by controlling a flip of a voltage of the drain electrode of the first photoelectric field effect transistor or a flip of a voltage of the source electrode of the second photoelectric field effect transistor, then an analog operation is completed inside the pixel unit, and a result is represented by a common output current; and during reset, a reset function of the pixel unit is completed by controlling a level signal of each port to return to zero, so as to prepare for a next exposure.

Figure 3D:
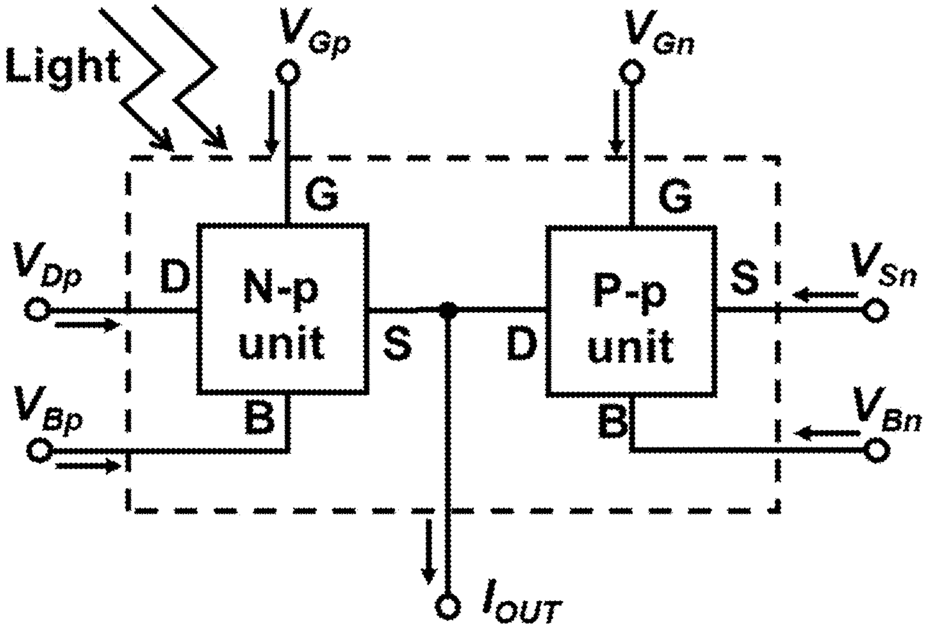
FIG. 3D shows a schematic structural diagram of the complementary phototransistor pixel unit composed of N-n unit and P-n unit according to embodiments of the present disclosure.

In the complementary phototransistor pixel unit composed of N-n unit and P-n unit shown in FIG. 3D, a type of the first photoelectric field effect transistor is N-n, i.e., NMOS on a n-type well, a type of the second photoelectric field effect transistor is P-n, i.e., PMOS on a n-type well, the source electrode S of the first photoelectric field effect transistor is connected to the drain electrode D of the second photoelectric field effect transistor to form a common output, denoted as IOUT, and other ports are separately led out.

The complementary phototransistor pixel unit utilizes complementary photoelectric characteristics of the first photoelectric field effect transistor and the second photoelectric field effect transistor to input a positive weight into the exposed first photoelectric field effect transistor to complete operation, input a negative weight into the exposed second photoelectric field effect transistor to complete operation, thereby allowing positive and negative weight operations to be compatible within one pixel unit.

The complementary phototransistor pixel unit could perform exposure, readout, and reset functions in operation, specifically including: during exposure, a collection and conversion of an optical signal in the pixel unit is implemented by controlling a flip of a voltage of the well base electrode; during readout, a device is turned on or off by controlling a flip of a voltage of the gate electrode, and a weight value input is completed by controlling a flip of a voltage of the drain electrode of the first photoelectric field effect transistor or a flip of a voltage of the source electrode of the second photoelectric field effect transistor, then an analog operation is completed inside the pixel unit, and a result is represented by a common output current; and during reset, a reset function of the pixel unit is completed by controlling a level signal of each port to return to zero, so as to prepare for a next exposure.

Based on the four complementary phototransistor pixel units composed of N-p unit and N-n unit, P-p unit and P-n unit, N-p unit and P-p unit, and N-n unit and P-n unit shown in FIG. 3A to FIG. 3D, the present disclosure further provides a complementary phototransistor sensing and computing array structure adapted for high parallel vector-matrix multiplication. The complementary phototransistor sensing and computing array structure includes: a plurality of complementary phototransistor pixel units, where the plurality of complementary phototransistor pixel units are arranged in an array structure.

In the complementary phototransistor sensing and computing array structure adapted for high parallel vector-matrix multiplication provided in the present disclosure, a plurality of complementary phototransistor pixel units are arranged into an array structure to form a scale array. By utilizing the photoelectric complementary characteristics, an input matrix (such as an image) may be mapped into the array during exposure, and the specific row selection can be achieved through word lines (WL), a weight vector could be applied to bit lines (BL) of the rows with voltage, the current could be collected in source line (SL) of each column as an operation result, and therefore the calculation of the vector is completed.

Based on the above-mentioned principle, taking the complementary phototransistor sensing and computing array structure composed of complementary phototransistor pixel units as shown in FIG. 3A as an example, for the complementary phototransistor sensing and computing array structure adapted for high parallel vector-matrix multiplication provided in the present disclosure, a connection relationship of the plurality of complementary phototransistor pixel units located in a same row of the complementary phototransistor sensing and computing array structure is as follows to implement row selection and weight value input functions: $V_{Bn}$ ends of the plurality of complementary phototransistor pixel units located in the same row are all connected to a first exposure enabling control line $EN^+$ of the row, and $V_{Bp}$ ends of the plurality of complementary phototransistor pixel units located in the same row are all connected to a second exposure enabling control line $EN^-$ of the row; $V_{Gn}$ ends of the plurality of complementary phototransistor pixel units located in the same row are all connected to a first word line $WL^+$ of the row, and $V_{Gp}$ ends of the plurality of complementary phototransistor pixel units located in the same row are all connected to a second word line $WL^-$ of the row; and $V_{Dn}$ ends of the plurality of complementary phototransistor pixel units located in the same row are all connected to a first bit line $BL^+$ of the row, and $V_{Dp}$ ends of the plurality of complementary phototransistor pixel units located in the same row are all connected to a second bit line $BL^-$ of the row. That is, the $V_{Bp}$ ends and $V_{Bn}$ ends of the plurality of pixel units in the same row are connected to the exposure control enabling lines $EN^-$ and $EN^+$ of the row, the $V_{Gp}$ ends and $V_{Gn}$ ends are connected to the word lines $WL^-$ and $WL^+$ of the row, and the $V_{Dp}$ ends and $V_{Dn}$ ends are connected to the bit lines $BL^-$ and $BL^+$ of the row, respectively, so as to implement row selection and weight input functions.

A connection relationship of the plurality of complementary phototransistor pixel units located in a same column of the complementary phototransistor sensing and computing array structure is as follows to achieve a collection of current along a column direction: $I_{OUT}$ ends of the plurality of complementary phototransistor pixel units located in the same column are all connected to a source line SL of the column. That is, the $I_{OUT}$ ends are connected to the source line SL of the column to achieve a collection of current along a column direction.

The above is an example of the complementary phototransistor sensing and computing array structure composed of complementary phototransistor pixel units shown in FIG. 3A, which provides a detailed description of the complementary phototransistor sensing and computing array structure adapted for high parallel vector-matrix multiplication provided in the present disclosure. For the complementary phototransistor sensing and computing array structure composed of complementary phototransistor pixel units shown in FIG. 3B, FIG. 3C, or FIG. 3D, the connection relationship and working principle are similar to those of the complementary phototransistor sensing and computing array structure composed of complementary phototransistor pixel units shown in FIG. 3A, which will not be described in detail here.

Based on the complementary phototransistor sensing and computing array structure composed of complementary phototransistor pixel units shown in FIG. 3A, the present disclosure further provides a method of operating the complementary phototransistor sensing and computing array structure, which specifically includes following steps:

(1) Exposure period: levels of a second exposure enabling control line $EN^-$ or a first exposure enabling control line $EN^+$ of a specific row are flipped to achieve exposure to the pixel units of the specific row. For a positive weight, a level of the first exposure enabling control line $EN^+$ is controlled to flip; and for a negative weight, a level of the second exposure enabling control line $EN^-$ is controlled to flip.

(2) Readout period: a level of the second word line $WL^-$ or the first word line $WL^+$ of a specific row is flipped to implement selection of the pixel units of the specific row; for a positive weight, a level of the first word line $WL^+$ is controlled to flip; for a negative weight, a level of the second word line $WL^-$ is controlled to flip. At the same time, a level of the second bit line BL or the first bit line $BL^+$ of the specific row is controlled to flip to achieve weight input; for a positive weight, a level of the first bit line $BL^+$ is controlled to flip; for a negative weight, a level of the second bit line $BL^-$ is controlled to flip; and during the period, a current is collected in a source line SL of each column, i.e., an operation result is read out.

(3) Reset period: levels of the first exposure enabling control line $EN^+$, the second exposure enabling control line $EN^-$, the first word line $WL^+$, the second word line $WL^-$, the first bit line $BL^+$, and the second bit line $BL^-$ are reset, and the array state is returned to an initial state.

(4) Parallel vector-matrix multiplication operation: levels of a first exposure enabling control line $EN^+$, a second exposure enabling control line $EN^-$, a first word line $WL^+$, and a second word line $WL^-$ of a specific row are flipped to implement exposure and selection of pixel units of the specific row, a weight value is input into the specific row through a bit line, and an analog operation is completed inside each pixel unit, and operation results are represented by a source line current of each column.

Figure 4:
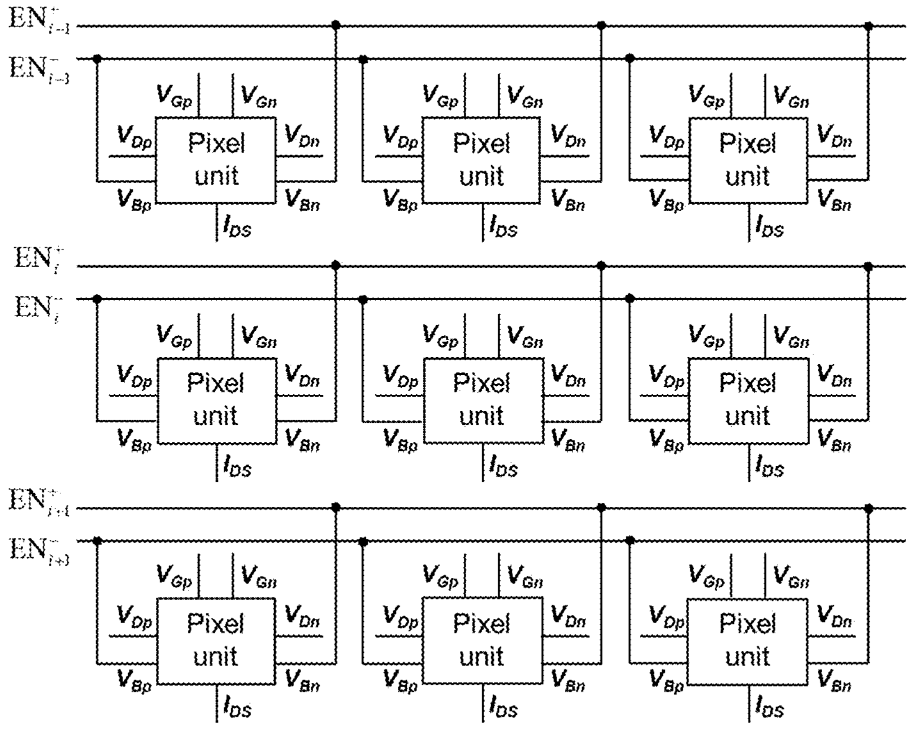
FIG. 4 shows a schematic diagram of the connection of the first exposure enabling control line $EN^+$ and the second exposure enabling control line $EN^-$ of the complementary phototransistor sensing and computing array structure according to embodiments of the present disclosure.

FIG. 4 shows a schematic diagram of a connection of a first exposure enabling control line $EN^+$ and a second exposure enabling control line $EN^-$ of a complementary phototransistor sensing and computing array structure according to embodiments of the present disclosure. The exposure enabling control line of the array is connected to the well base electrode of the pixel unit, and due to the different well voltages required for the exposure of N-n unit and N-p unit, $EN^-$ and $EN^+$ are introduced respectively. Structurally, the well base electrodes $V_{Bn}$ of N-n units in all the pixel units of the same row of the array are connected to $EN^+$, while the well base electrodes $V_{Bp}$ of N-p units in all the pixel units of the same row of the array is connected to $EN^-$. The exposure enabling control line could achieve row exposure function.

Figure 5:
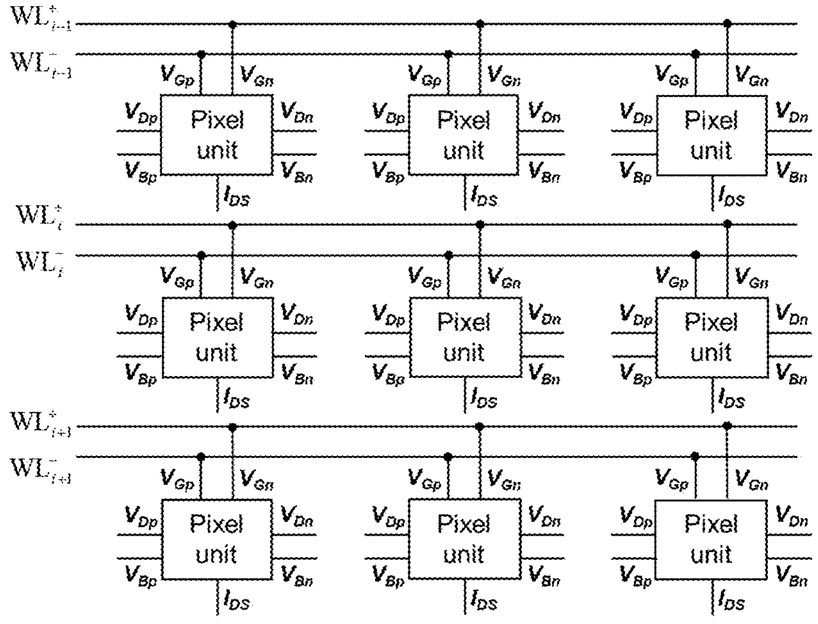
FIG. 5 shows a schematic diagram of the connection of the first word line $WL^+$ and the second word line $WL^-$ of the complementary phototransistor sensing and computing array structure according to embodiments of the present disclosure.

FIG. 5 shows a schematic diagram of a connection of a first word line $WL^+$ and a second word line $WL^-$ of a complementary phototransistor sensing and computing array structure according to embodiments of the present disclosure. The word lines of the array are connected to the gate electrode of the pixel unit and are configured to control device selection, and have two types: $WL^-$ and $WL^+$. When the weight is a positive value, the weight is controlled by $WL^+$, and when the weight is a negative value, the weight is controlled by $WL^-$. Structurally, the gate electrodes $V_{Gn}$ of N-n units in all the pixel units of the same row of the array are connected to $WL^+$, while the gate electrodes $V_{Gp}$ of N-p units in all the pixel units of the same row of the array are connected to $WL^-$. The word line could achieve row selection function.

Figure 6:
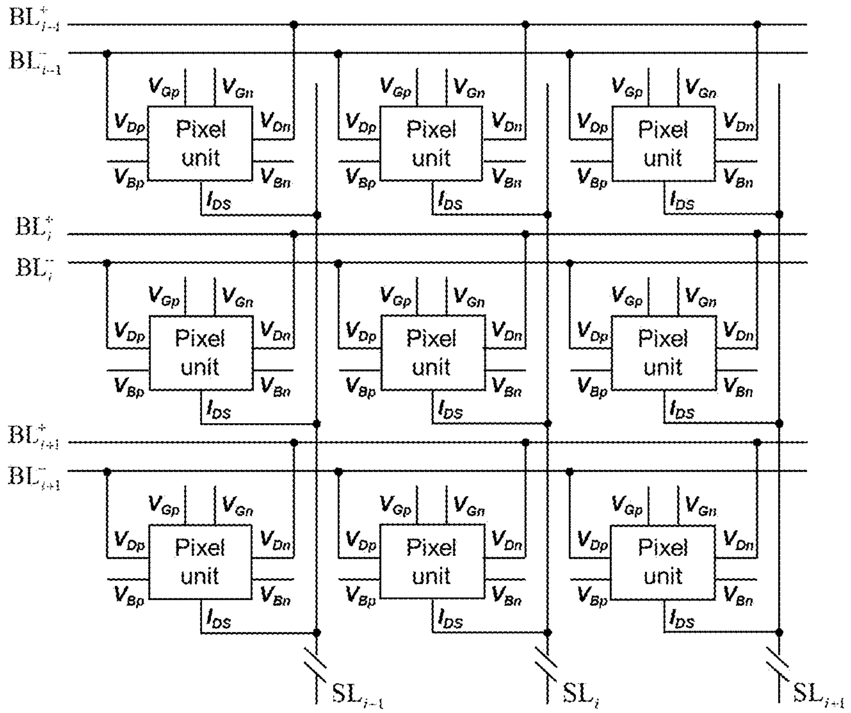
FIG. 6 shows a schematic diagram of the connection of the first bit line $BL^+$, the second bit line $BL^-$, and the source line SL of the complementary phototransistor sensing and computing array structure according to embodiments of the present disclosure.

FIG. 6 shows a schematic diagram of a connection of a first bit line $BL^+$, a second bit line $BL^-$, and a source line SL of a complementary phototransistor sensing and computing array structure according to embodiments of the present disclosure. The bit lines of the array are connected to the drain electrode of the pixel unit and are configured for weight input, and have two types: $BL^-$ and $BL^+$. When the weight is a positive value, the weight is controlled by $BL^+$, and when the weight is a negative value, the weight is controlled by $BL^-$. Structurally, the drain electrodes $V_{Dn}$ of N-n units in all the pixel units of the same row of the array are connected to $BL^+$, while the drain electrodes $V_{Dp}$ of N-p units in all the pixel units of the same row of the array are connected to $BL^-$. The bit line may achieve weight input function. The source line SL of the array is connected to the common source electrode of the pixel unit and is configured to collect an operation result (current) of the pixel unit. Structurally, the common source electrode of all pixel units in the same column of the array is connected to the SL. The source line could achieve the accumulation function of the current of the same column.

Figure 7:
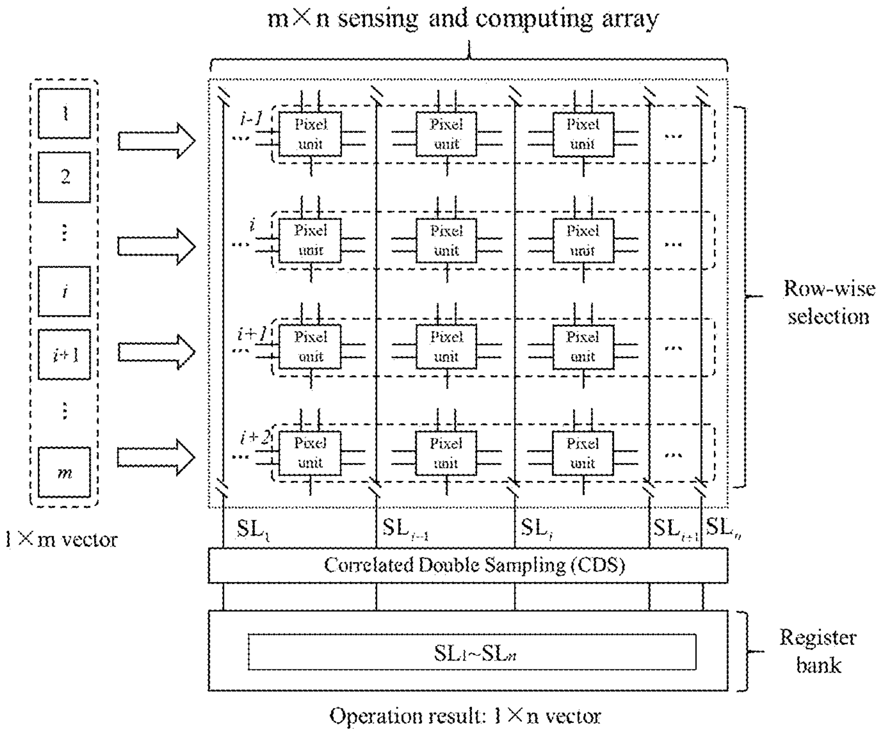
FIG. 7 shows a schematic diagram of the complementary phototransistor sensing and computing array structure performing parallel vector-matrix multiplication operation according to embodiments of the present disclosure.

FIG. 7 shows a schematic diagram of a complementary phototransistor sensing and computing array structure performing parallel vector-matrix multiplication operation according to embodiments of the present disclosure. The following description will be given by taking the operation of 1×m row vector and m×n sensing and computing integrated array as an example. Firstly, the positive and negative of each value in the row vector of 1×m are determined. For a positive value, a positive exposure enabling control line $EN^+$, a positive word line $WL^+$, and a positive bit line $BL^+$ of a corresponding row are selected during the operation; and for a negative value, a negative exposure enabling control line $EN^-$, a negative word line $WL^-$, and a negative bit line BL of a corresponding row are selected during the operation. Afterwards, by using the exposure enabling control line $EN^+$ or $EN^-$ to control the exposure of all rows (m) of the array, a collection and conversion of an optical signal is completed, i.e., m×n matrix input. The m values in the row vector correspond to the m rows of the array one by one, the word line $WL^+$ or $WL^-$ of the rows is selected, the row vector is input into the array through the bit line $BL^+$ or $BL^-$, an analog multiplication operation is completed in each pixel unit of the array, an accumulation operation is completed by the source line SL of each column, and a vector-matrix multiplication operation result, i.e., 1×n row vector, is obtained after correlated double sampling (CDS) circuit, and the result could be stored in a register or transmitted to a next level circuit.

Based on the complementary phototransistor sensing and computing array structure adapted for high parallel vector-matrix multiplication provided in the present disclosure, the present disclosure further provides a high parallel convolution operation method adapted for in-sense computation, and in the method a convolution kernel slides in an input matrix to complete an convolution operation, which may be divided into sub processes of sliding column vectors forming the convolution kernel slides in the input matrix to complete a product accumulation, and the timing sequence control may be adjusted through a form of vector-product accumulation operation to complete a convolution operation.

Based on the above principle, the high parallel convolution operation method adapted for in-sense computation proposed in the present disclosure includes following steps:

(1) Preprocessing period: a k×k convolution kernel is divided into k column vectors, the k column vectors are sequentially arranged from right to left, a rightmost vector of the convolution kernel is the first vector in a queue, and k is a natural number.

(2) Exposure period: for a m×n input matrix, m rows of the m×n input matrix are exposed by a first exposure enabling control line $EN^+$ or a second exposure enabling control line $EN^-$ to complete a collection and conversion of an optical signal, where m and n are natural numbers. A partial exposure of non-global exposure or a drum exposure method is used for a larger array.

(3) Readout period and reset period: under a readout clock signal, a first word line $WL^+$ or a second word line $WL^-$ is selected according to a difference of positive and negative values in a first column vector of a queue, and a weight value of the vector is controlled to be input into an array through a first bit line $BL^+$ or a second bit line $BL^-$ of 1 to k rows, results of analog operations completed in the array are output in parallel through a source line SL of each column, and effective data columns $SL_k$ to $SL_n$ are selected to store in a register; a second column vector of the queue is controlled to be input into the array to complete operation under a next readout clock signal, and effective data columns $SL_{k-1}$ to $SL_{n-1}$ are selected to store in the register; then, the above process is repeated under a control of a readout clock until the last one column vector of the queue is input into the array to complete operation, and effective data columns $SL_1$ to $SL_{n-k}$ are selected to store in the register, and effective data of each column vector operation are correspondingly added by an addition circuit for operation results of the whole queue to obtain 1×(n-k) row vector, i.e., a first row of an output matrix; and then the selected row of the array is controlled to move downwards row by row, the above process is repeated, k column vectors of the queue are sequentially input into the array for operation, effective data of each column vector operation are correspondingly added by the addition circuit, a second row to a (n-k)$^{th}$ row of the output matrix are sequentially obtained, and the (n-k)×(n-k) output matrix is obtained finally.

After completing the above-mentioned process, reset signals of each control line are reset to wait for a next operation process.

It should be noted that a one-exposure multi-reading mode is adopted when a convolution operation is performed on the array, so that a second exposure enabling control line $EN^-$ and a first exposure enabling control line $EN^+$ of a specific row are exposed simultaneously during the exposure period to adapt to a readout of positive and negative weight values during the readout period, which is different from the above-mentioned single vector-matrix multiplication operation in which only $EN^-$ is selected or only $EN^+$ is selected. In addition, for a case that a convolution step size is not 1, the array and method may still complete the operation, and only a selection and storage of the operation result at the source line SL needs to be adjusted.

Figure 8:
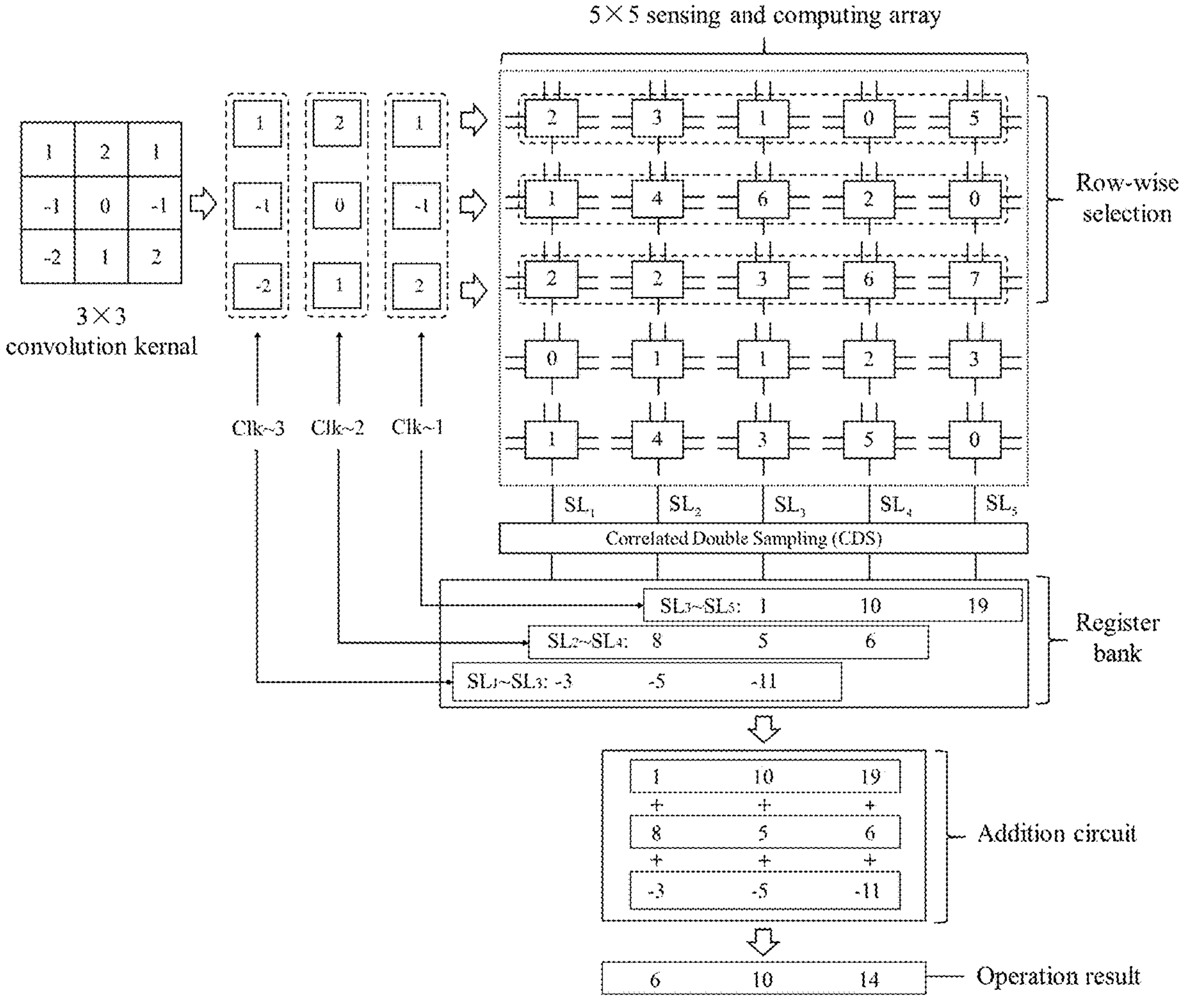
FIG. 8 shows a schematic diagram of the complementary phototransistor sensing and computing array structure performing high parallel convolution operation according to embodiments of the present disclosure.

FIG. 8 shows a schematic diagram of a complementary phototransistor sensing and computing array structure performing high parallel convolution operation according to embodiments of the present disclosure. For a 5×5 sensing and computing integrated array, taking a 3×3 convolution kernel with convolution step length equal to 1 as an example, when performing the operation, the convolution kernel needs to be divided into three column vectors, and then the three column vectors are input into the array sequentially from right to left for operation. First, the exposure enabling control lines $EN^+$ and $EN^-$ are used to control the exposure of 1 to 5 rows in the sensing and computing integrated array, then the gating of 1 to 3 rows is controlled through the word line $WL^+$ or $WL^-$ according to a difference of positive and negative values in the column vector, and the weight value is input into the array through the control of the bit line $BL^+$ or $BL^-$, and results of analog operations completed in the array are output in parallel by the source line SL of each column. In the first readout clock Clk~1, the operation of the column vector on the right side of the convolution kernel may be completed, and operation results of the 3$^{rd}$ to 5$^{th}$ columns may be selected to store in a register after passing through the correlated double sampling (CDS) circuit; in the second readout clock Clk~2, the operation of the column vector in the middle of the convolution kernel may be completed, and operation results of the 2$^{nd}$ to 4$^{th}$ columns may be selected to store in the register after passing through the correlated double sampling circuit; in the third readout clock Clk~3, the operation of the column vector on the left side of the convolution kernel may be completed, and operation results of the 1$^{st}$ to 3$^{rd}$ columns may be selected to store in the register after passing through the correlated double sampling circuit. By adding corresponding values of the three operation results through an addition circuit, the convolution operation result 1 (row vector of 1×3) may be obtained. Then the selected row is controlled to move down by one row, the above process is repeated, and the operation and storage of the three column vectors of the convolution core is completed by utilizing three clock cycles from Clk~4 to Clk~6. By adding corresponding values of the three operation results through the addition circuit, the convolution operation result 2 (row vector of 1×3) may be obtained. Similarly, the selected row is controlled to move down by one row again, the above process is repeated, the convolution operation result 3 (row vector of 1×3) may be obtained. After the above process, an output matrix with the size of 3×3 is obtained finally. In addition, for a case that a convolution step size is not 1, the array may still complete the operation, and only a selection and storage of the operation results at the source line SL needs to be adjusted.

Figure 9:
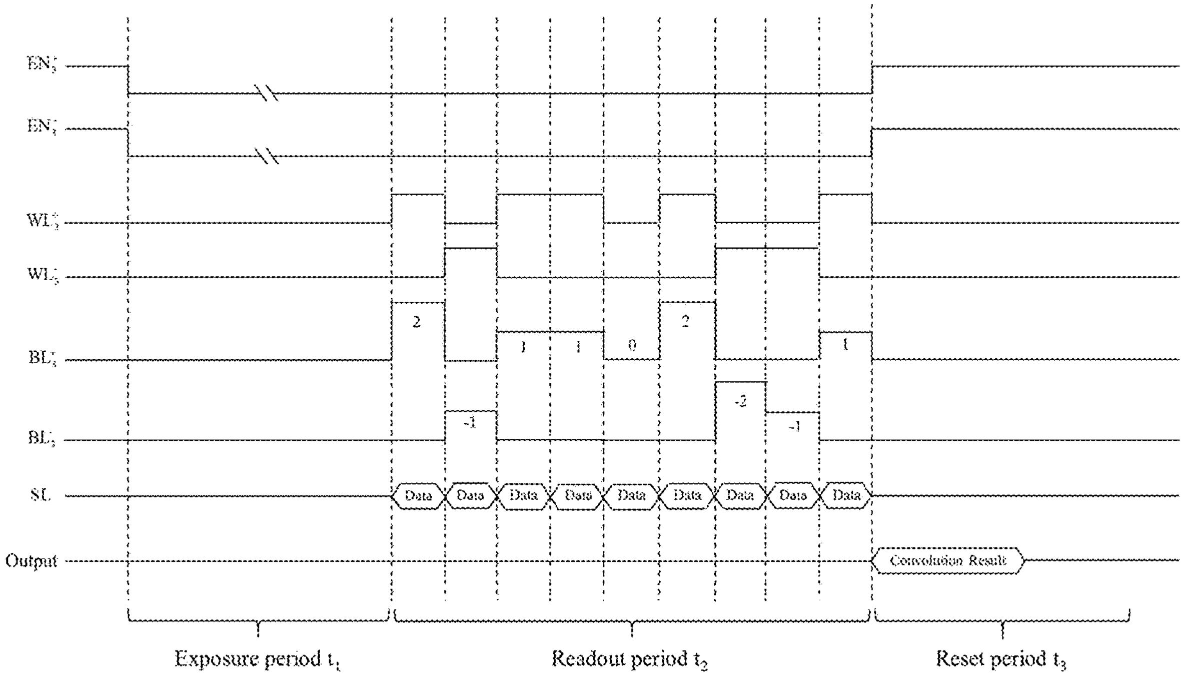
FIG. 9 shows a schematic diagram of the timing control for high parallel convolution operation performed by the complementary phototransistor sensing and computing array structure according to embodiments of the present disclosure.

FIG. 9 shows a schematic diagram of the timing control for high parallel convolution operation performed by the complementary phototransistor sensing and computing array structure according to embodiments of the present disclosure. The array may, but is not limited to, achieve high parallel convolution operation through the following time sequence control. Taking the above-mentioned 3×3 convolutional kernel and the third row of the 5×5 array as an example, first, the row exposure is achieved by the level flipping of exposure enabling control lines $EN_3^+$ and $EN_3^-$ of the third row. After the exposure period, the levels of $EN_3^+$ and $EN_3^-$ are kept unchanged, a word line $WL_3^+$ or $WL_3^-$ of the row is selected, and then 9 weight values are input into a bit line $BL_3^+$ or $BL_3^-$ of the row from bottom to top and from right to left, to implement one-exposure multi-reading mode. It should be noted that before row selection and weight input, it is necessary to determine whether a weight in the convolution kernel is positive or negative. For a positive weight, a positive word line and a positive bit line corresponding to the row are selected, and for a negative weight, a negative word line and a negative bit line corresponding to the row are selected. During the readout period, each readout clock completes the operation and outputs the operation results in parallel through the SL of each column. The data is screened and stored in the register. During the reset period, the addition circuit obtains the final operation result by correspondingly adding the data in the register group, and each signal completes the reset process.

Figure 10:
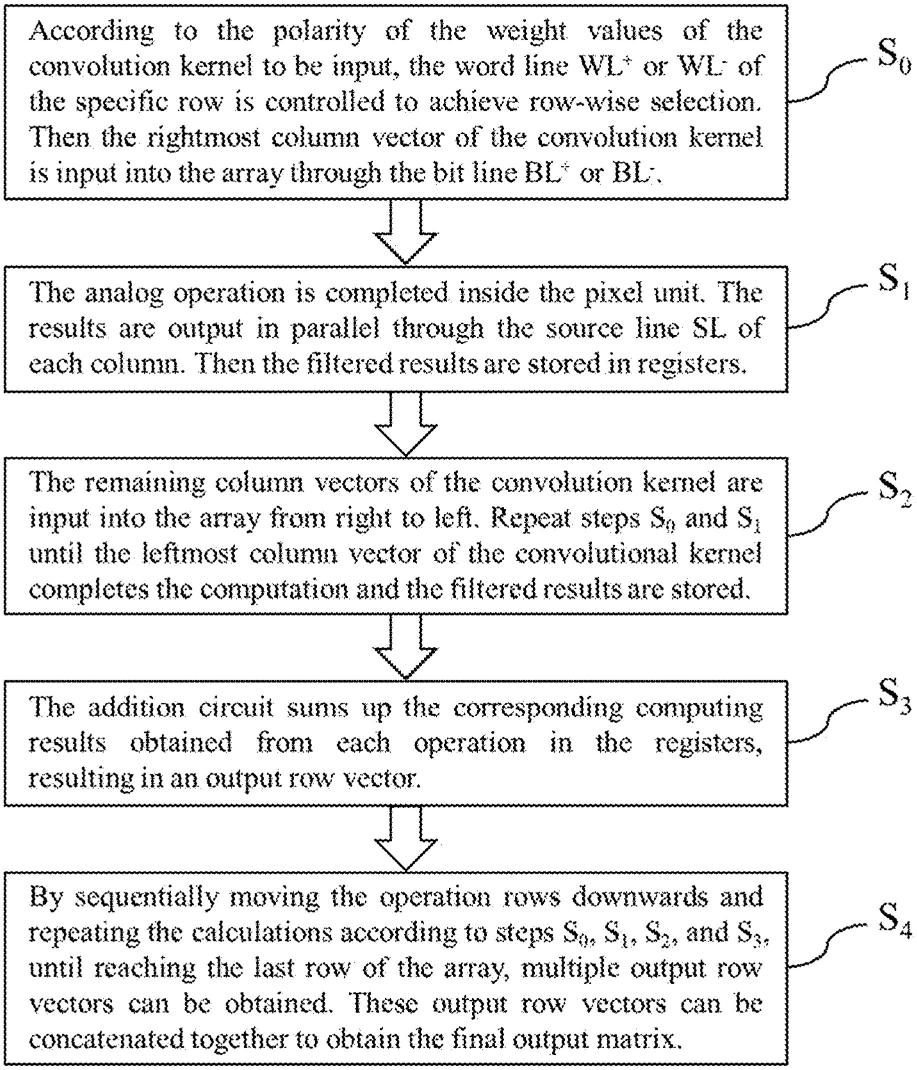
FIG. 10 shows a flowchart of a complementary phototransistor sensing and computing array structure performing high parallel convolution operation according to embodiments of the present disclosure.

FIG. 10 shows a flowchart of a complementary phototransistor sensing and computing array structure performing high parallel convolution operation according to embodiments of the present disclosure, including following steps:

In step $S_0$, according to the polarity of the weight values of the convolution kernel to be input, the word line $WL^+$ or $WL^-$ of the specific row is controlled to achieve row-wise selection. Then the rightmost column vector of the convolution kernel is input into the array through the bit line $BL^+$ or $BL^-$.

In step $S_1$, the analog operation is completed inside the pixel unit. The results are output in parallel through the source line SL of each column. Then the filtered results are stored in registers.

In step $S_2$, the remaining column vectors of the convolution kernel are input into the array from right to left. Repeat steps $S_0$ and $S_1$ until the leftmost column vector of the convolutional kernel completes the computation and the filtered results are stored.

In step $S_3$, the addition circuit sums up the corresponding computing results obtained from each operation in the registers, resulting in an output row vector.

In step $S_4$, by sequentially moving the operation rows downwards and repeating the calculations according to steps $S_0$, $S_1$, $S_2$, and $S_3$, until reaching the last row of the array, multiple output row vectors can be obtained. These output row vectors can be concatenated together to obtain the final output matrix.

Compared with the related art, the complementary phototransistor pixel unit capable of simultaneously calculating positive and negative weight values, the complementary phototransistor sensing and computing array structure adapted for high parallel vector-matrix multiplication and an operation method thereof, and the high parallelism convolution operation implementation method adapted for in-sensor computing provided in the present disclosure have following beneficial effects:

1. The present disclosure utilizes complementary optoelectronic characteristics of photoelectric field effect transistors based on an ultra-thin body and buried oxide layer (UTBB), and uses a pair of different types of optoelectronic field effect transistors to form a complementary phototransistor pixel unit, and the complementary phototransistor pixel unit could simultaneously calculate positive and negative weight values without the need to design different readout and control circuits, simplifying the complexity of an array structure and an operation method.
2. The present disclosure designs a complementary phototransistor sensing and computing array structure adapted for high parallel vector-matrix multiplication based on the complementary phototransistor pixel unit and an operation method, which may complete a solution of vector-matrix operation within one clock cycle, effectively reduce the complexity of array structure and time sequence operation while ensuring high parallelism, improve the parallelism of array operation, and meet the requirement of reusing an operational matrix.
3. The highly parallel convolution operation method provided in the present disclosure divides a convolution kernel into column vectors, so that it also has an advantage of solving in a single clock cycle of vector matrix operation; device characteristics of supporting multiple times of reading with one exposure are utilized to reduce exposure time occupation; the computational parallelism is improved by using an operation mode of row parallel input and column parallel output. A convolution operation result may be obtained by simply summing array calculation results at a back end, so that peripheral circuits and additional operation are reduced, and a hardware convolution process is simplified.

Those skilled in the art will appreciate that although the present disclosure has been illustrated and described with reference to specific exemplary embodiments of the present disclosure, they should understand that without departing from the spirit and scope of the present disclosure defined by the appended claims and their equivalents, various changes in forms and details may be made to the present disclosure. Therefore, the scope of the present disclosure should not be limited to the aforementioned embodiments, but should be determined not only by the appended claims, but also by the equivalents of the appended claims.

What is claimed is:

1. A complementary phototransistor pixel unit capable of simultaneously calculating positive and negative weight values, wherein the complementary phototransistor pixel unit comprises:

a first photoelectric field effect transistor, wherein the first photoelectric field effect transistor is a photoelectric field effect transistor based on an ultra-thin body and buried oxide layer (UTBB); and a second photoelectric field effect transistor, wherein the second photoelectric field effect transistor is a photoelectric field effect transistor based on an ultra-thin body and buried oxide layer, and a type of the second photoelectric field effect transistor is different from a type of the first photoelectric field effect transistor, wherein each of the first photoelectric field effect transistor and the second photoelectric field effect transistor is a four-end device and has a gate electrode G, a source electrode S, a drain electrode D, and a well base electrode B, and the source electrode S or the drain electrode D of the first photoelectric field effect transistor is connected to the source electrode S or the drain electrode D of the second photoelectric field effect transistor, wherein each of the first photoelectric field effect transistor and the second photoelectric field effect transistor comprises:

a doped well; and a UTBB field effect transistor formed on the doped well, wherein a doping type of the doped well is n-type or p-type, and the UTBB field effect transistor is an NMOS transistor or a PMOS transistor, wherein, for the first photoelectric field effect transistor and the second photoelectric field effect transistor, when the doping types of the doping wells of the first photoelectric field effect transistor and the second photoelectric field effect transistor are the same, the types of the UTBB field effect transistors of the first photoelectric field effect transistor and the second photoelectric field effect transistor are different, and when the doping types of the doping wells of the first photoelectric field effect transistor and the second photoelectric field effect transistor are different, the types of the UTBB field effect transistors of the first photoelectric field effect transistor and the second photoelectric field effect transistor are the same.

2. The complementary phototransistor pixel unit capable of simultaneously calculating positive and negative weight values according to claim 1, wherein a type of the first photoelectric field effect transistor is N-p (NMOS on p-type well), a type of the second photoelectric field effect transistor is N-n (NMOS on n-type well), and the source electrode S of the first photoelectric field effect transistor is connected to the source electrode S of the second photoelectric field effect transistor to form a common source electrode, denoted as $I_{OUT}$.

3. The complementary phototransistor pixel unit capable of simultaneously calculating positive and negative weight values according to claim 2, wherein the complementary phototransistor pixel unit utilizes complementary photoelectric characteristics of the first photoelectric field effect transistor and the second photoelectric field effect transistor to input a negative weight into an exposed first photoelectric field effect transistor to complete operation, and input a positive weight into an exposed second photoelectric field effect transistor to complete operation, thereby allowing positive and negative weight operations to be compatible within one pixel unit.

4. The complementary phototransistor pixel unit capable of simultaneously calculating positive and negative weight values according to claim 2, wherein the complementary phototransistor pixel unit is capable of performing exposure, readout, and reset functions in operation, comprising:

during exposure, a collection and conversion of an optical signal in the pixel unit is implemented by controlling a flip of a voltage of the well base electrode;

during readout, the device is turned on or off by controlling a flip of a voltage of the gate electrode, a weight value input is completed by controlling a flip of a voltage of the drain electrode, an analog operation is completed inside the pixel unit, and a result is represented by a common source current; and during reset, a reset function of the pixel unit is completed by controlling a level signal of each port to return to zero, so as to prepare for a next exposure.

5. The complementary phototransistor pixel unit capable of simultaneously calculating positive and negative weight values according to claim 1, wherein a type of the first photoelectric field effect transistor is P-p (PMOS on p-type well), a type of the second photoelectric field effect transistor is P-n (PMOS on n-type well), and the drain electrode D of the first photoelectric field effect transistor is connected to the drain electrode D of the second photoelectric field effect transistor to form a common drain electrode, denoted as $I_{OUT}$.

6. The complementary phototransistor pixel unit capable of simultaneously calculating positive and negative weight values according to claim 5, wherein the complementary phototransistor pixel unit utilizes complementary photoelectric characteristics of the first photoelectric field effect transistor and the second photoelectric field effect transistor to input a positive weight into an exposed first photoelectric field effect transistor to complete operation, and input a negative weight into an exposed second photoelectric field effect transistor to complete operation, thereby allowing positive and negative weight operations to be compatible within one pixel unit.

7. The complementary phototransistor pixel unit capable of simultaneously calculating positive and negative weight values according to claim 5, wherein the complementary phototransistor pixel unit is capable of performing exposure, readout, and reset functions in operation, comprising:

during exposure, a collection and conversion of an optical signal in the pixel unit is implemented by controlling a flip of a voltage of the well base electrode;

during readout, the device is turned on or off by controlling a flip of a voltage of the gate electrode, a weight value input is completed by controlling a flip of a voltage of the source electrode, an analog operation is completed inside the pixel unit, and a result is represented by a common drain current; and during reset, a reset function of the pixel unit is completed by controlling a level signal of each port to return to zero, so as to prepare for a next exposure.

8. The complementary phototransistor pixel unit capable of simultaneously calculating positive and negative weight values according to claim 1, wherein a type of the first photoelectric field effect transistor is N-p (NMOS on p-type well), a type of the second photoelectric field effect transistor is P-p (PMOS on p-type well), and the source electrode S of the first photoelectric field effect transistor is connected to the drain electrode D of the second photoelectric field effect transistor to form a common output, denoted as $I_{OUT}$.

9. The complementary phototransistor pixel unit capable of simultaneously calculating positive and negative weight values according to claim 8, wherein the complementary phototransistor pixel unit utilizes complementary photoelectric characteristics of the first photoelectric field effect transistor and the second photoelectric field effect transistor to input a negative weight into an exposed first photoelectric field effect transistor to complete operation, and input a positive weight into an exposed second photoelectric field effect transistor to complete operation, thereby allowing positive and negative weight operations to be compatible within one pixel unit.

10. The complementary phototransistor pixel unit capable of simultaneously calculating positive and negative weight values according to claim 8, wherein the complementary phototransistor pixel unit is capable of performing exposure, readout, and reset functions in operation, comprising:

during exposure, a collection and conversion of an optical signal in the pixel unit is implemented by controlling a flip of a voltage of the well base electrode;

during readout, the device is turned on or off by controlling a flip of a voltage of the gate electrode, a weight value input is completed by controlling a flip of a voltage of the drain electrode of the first photoelectric field effect transistor or a flip of a voltage of the source electrode of the second photoelectric field effect transistor, an analog operation is completed inside the pixel unit, and a result is represented by a common output current; and during reset, a reset function of the pixel unit is completed by controlling a level signal of each port to return to zero, so as to prepare for a next exposure.

11. The complementary phototransistor pixel unit capable of simultaneously calculating positive and negative weight values according to claim 1, wherein a type of the first photoelectric field effect transistor is N-n (NMOS on n-type well), a type of the second photoelectric field effect transistor is P-n (PMOS on n-type well), and the source electrode S of the first photoelectric field effect transistor is connected to the drain electrode D of the second photoelectric field effect transistor to form a common output, denoted as $I_{OUT}$.

12. The complementary phototransistor pixel unit capable of simultaneously calculating positive and negative weight values according to claim 11, wherein the complementary phototransistor pixel unit utilizes complementary photoelectric characteristics of the first photoelectric field effect transistor and the second photoelectric field effect transistor to input a positive weight into an exposed first photoelectric field effect transistor to complete operation, input a negative weight into an exposed second photoelectric field effect transistor to complete operation, thereby allowing positive and negative weight operations to be compatible within one pixel unit, wherein the complementary phototransistor pixel unit is capable of performing exposure, readout, and reset functions in operation, comprising:

during exposure, a collection and conversion of an optical signal in the pixel unit is implemented by controlling a flip of a voltage of the well base electrode;

during readout, the device is turned on or off by controlling a flip of a voltage of the gate electrode, a weight value input is completed by controlling a flip of a voltage of the drain electrode of the first photoelectric field effect transistor or a flip of a voltage of the source electrode of the second photoelectric field effect transistor, an analog operation is completed inside the pixel unit, and a result is represented by a common output current; and during reset, a reset function of the pixel unit is completed by controlling a level signal of each port to return to zero, so as to prepare for a next exposure.

13. A complementary phototransistor sensing and computing array structure adapted for high parallel vector-matrix multiplication, comprising:

a plurality of complementary phototransistor pixel units according to claim 1, wherein the plurality of complementary phototransistor pixel units are arranged in an array structure.

14. The complementary phototransistor sensing and computing array structure adapted for high parallel vector-matrix multiplication according to claim 13, wherein a connection relationship of a plurality of complementary phototransistor pixel units located in a same row of the complementary phototransistor sensing and computing array structure is as follows to implement row selection and weight value input functions:

$V_{Bn}$ ends of the plurality of complementary phototransistor pixel units located in the same row are all connected to a first exposure enabling control line $EN^+$ of the row, and $V_{Bp}$ ends of the plurality of complementary phototransistor pixel units located in the same row are all connected to a second exposure enabling control line $EN^-$ of the row;

$V_{Gn}$ ends of the plurality of complementary phototransistor pixel units located in the same row are all connected to a first word line $WL^+$ of the row, and $V_{Gp}$ ends of the plurality of complementary phototransistor pixel units located in the same row are all connected to a second word line $WL^-$ of the row; and $V_{Dn}$ ends of the plurality of complementary phototransistor pixel units located in the same row are all connected to a first bit line $BL^+$ of the row, and $V_{Dp}$ ends of the plurality of complementary phototransistor pixel units located in the same row are all connected to a second bit line $BL^-$ of the row, wherein a connection relationship of a plurality of complementary phototransistor pixel units located in a same column of the complementary phototransistor sensing and computing array structure is as follows to implement a collection of current along a column direction:

$I_{OUT}$ ends of the plurality of complementary phototransistor pixel units located in the same column are all connected to a source line SL of the column.

15. A method of operating the complementary phototransistor sensing and computing array structure according to claim 13, wherein the method comprises:

during parallel vector-matrix operation, flipping levels of a first exposure enabling control line $EN^+$, a second exposure enabling control line $EN^-$, a first word line $WL^+$, and a second word line $WL^-$ of a specific row to implement exposure and selection of pixel units of the specific row, inputting a weight value into the specific row through a bit line, and completing an analog operation inside each pixel unit, wherein operation results are represented by a source line current of each column.

16. The method of operating the complementary phototransistor sensing and computing array structure according to claim 15, wherein the method further comprises:

during an exposure period, flipping a level of a second exposure enabling control line $EN^-$ or a level of a first exposure enabling control line $EN^+$ of a specific row to implement exposure to the pixel units of the specific row, wherein during the exposure period, for a positive weight, a level of the first exposure enabling control line $EN^+$ is controlled to flip; and for a negative weight, a level of the second exposure enabling control line $EN^-$ is controlled to flip, wherein the method further comprises:

during a readout period, flipping a level of the second word line $WL^-$ or a level of the first word line $WL^+$ of a specific row to implement selection of the pixel units of the specific row; and controlling a level of the second bit line $BL^-$ or the first bit line $BL^+$ of the specific row to flip to implement a weight input; and during the period, collecting a current in a source line SL of each column, so that an operation result is read out, wherein during the readout period, when implementing the selection of the pixel units in the row, for a positive weight, a level of the first word line $WL^+$ is controlled to flip; for a negative weight, a level of the second word line $WL^-$ is controlled to flip; and wherein during the readout period, when implementing weight input, for a positive weight, a level of the first bit line $BL^+$ is controlled to flip; for a negative weight, a level of the second bit line $BL^-$ is controlled to flip, wherein the method further comprises:

during a reset period, resetting levels of the first exposure enabling control line $EN^+$, the second exposure enabling control line $EN^-$, the first word line $WL^+$, the second word line $WL^-$, the first bit line $BL^+$ and the second bit line $BL^-$, and returning an array state to an initial state.

17. A method of highly parallel convolutional operation of the complementary phototransistor sensing and computing array structure according to claim 13, wherein the method comprises:

during a readout period and a reset period, under a readout clock signal, controlling selection of a first word line $WL^+$ or a second word line $WL^-$ according to a difference of positive and negative values in a first column vector of a queue, and controlling a weight value of the vector to be input into an array through a first bit line $BL^+$ or a second bit line $BL^-$ of 1 to k rows, outputting results of analog operations completed in the array in parallel through a source line SL of each column, and selecting effective data columns $SL_k$ to $SL_n$ to store in a register;

controlling a second column vector of the queue to be input into the array to complete operation under a next readout clock signal, and selecting effective data columns $SL_{k-1}$ to $SL_{n-1}$ to store in the register;

repeating the above process under a control of a readout clock until a last column vector of the queue is input into the array to complete operation, and selecting effective data columns $SL_1$ to $SL_{n-k}$ to store in the register, and correspondingly adding effective data of each column vector operation by an addition circuit for operation results of the whole queue, so as to obtain $1\times(n\text{-}k)$ row vector which is a first row of the output matrix; and controlling a gated row of the array to move downwards row by row, repeating the above process, sequentially inputting k column vectors of the queue into the array for operation, correspondingly adding effective data of each column vector operation by the addition circuit, sequentially obtaining a second row to a $(n\text{-}k)^{th}$ row of the output matrix, and finally obtaining a $(n\text{-}k)\times(n\text{-}k)$ output matrix.

18. The method of highly parallel convolutional operation according to claim 17, wherein the method further comprises:

after completing the above process, resetting signals of each control line and waiting for a next operation process, wherein the method adopts a one-exposure multi-reading mode when a convolution operation is performed on the array, so that a second exposure enabling control line $EN^-$ and a first exposure enabling control line $EN^+$ of a specific row are exposed simultaneously during an exposure period to adapt to a readout of positive and negative weight values during the readout period, wherein for a case that a convolution step size is not 1, the method adjusts a selection and storage of an operation result of a source line SL end when a convolution operation is performed on the array, wherein the method further comprises:

during a preprocessing period, dividing a $k\times k$ convolution kernel into k column vectors, and sequentially arranging the k column vectors from right to left, wherein a rightmost vector of the convolution kernel is the first vector in a queue, and k is a natural number, wherein the method further comprises:

during the exposure period, for a $m\times n$ input matrix, exposing m rows of the $m\times n$ input matrix by a first exposure enabling control line $EN^+$ or a second exposure enabling control line $EN^-$ to complete a collection and conversion of an optical signal, wherein m and n are natural numbers, wherein during the exposure period, a partial exposure of non-global exposure or a drum exposure method is used for a larger array.

* * * * *